SEMICONDUCTING MATERIAL AND DEVICES MADE THEREFROM

Filed May 10, 1957

INVENTOR
J. H. WERNICK
BY
George S. Indig
ATTORNEY

United States Patent Office 2,882,470

Patented Apr. 14, 1959

2,882,470

SEMICONDUCTING MATERIAL AND DEVICES MADE THEREFROM

Jack H. Wernick, Morristown, N.J., assignor to Bell Telephone Laboratories, Incorporated, New York, N.Y., a corporation of New York Application May 10, 1957, Serial No. 658,434

11 Claims. (Cl. 317—237)

This invention relates to an new ternary semiconductive compound and to semiconductive devices made therefrom.

In accordance with this invention, there has been discovered a new semiconducting compound having the composition $Cu_3SbSe_4$. This new material has an intrinsic energy gap of 0.2 electron volt and evidences p-type conductivity as made. Methods by which this material may be converted to n-type conductivity are described herein so that this new material may be utilized both in point-type and in junction-type semiconductor devices such, for example, as rectifiers and transistors. Other device uses include photo devices such as infrared detectors.

The compound of this invention is discussed herein in terms of its electrical and physical properties and also its use in two typical semiconductor transducing devices; one point-type and one junction-type. Since this compound is not known to occur in nature, a method by which it has been synthesized is described.

The invention may be more easily understood by reference to the following figures in which.

Figure 1:
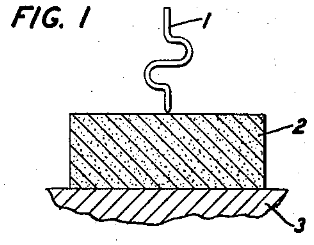
Fig. 1 is a schematic front elevational view in section of a point-type diode utilizing the compound herein.

Referring again to Fig. 1, point-electrode 1 makes rectifying contact with semiconductor block 2 which contains $Cu_3SbSe_4$ so modified by the inclusion of one or more significant impurities or other means as to exhibit extrinsic conductivity. Semiconductor block 2 makes ohmic contact with base 3 which may be made of copper. As is well known to those skilled in the art, such ohmic connection may be made, for example, by use of a solder containing a material having an excess of electrons where the material of semiconductor block 2 is n-type, and a deficiency of electrons where the material of semiconductor block 2 is p-type. Methods of making satisfactory point contact are well known and are not discussed. For suitable materials for the construction of a point-type electrode such as electrode 1 and for suitable methods of pointing such electrodes and bringing them to bear on the surface of block 2, attention is directed to 81 Physical Review 882 (1951), and 175 Transactions of the A.I.M.E. 606 (1948). A point-type diode such as that depicted in Fig. 1 is an asymmetrical element conducting more readily in the one direction than in the other. Where the material of semiconductor block 2 is n-type, ready conduction occurs with electrode 1 biased positive with respect to base 3. Where the material of block 2 is p-type ready conduction occurs with electrode 1 biased negative with respect to base 3.

Figure 2:
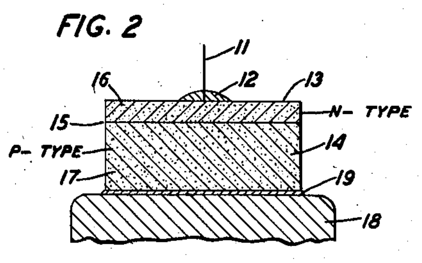
Fig. 2 is a schematic front elevational view in section of a junction-type diode utilizing the compound herein.

The device of Fig. 2 is a junction-type diode consisting of electrode 11 making ohmic connection 12 with surface 13 of block 14 which contains $Cu_3SbSe_4$ and which block contains p-n junction 15 between region 16 which is of one conductivity type and region 17 of the opposite conductivity type. Semiconductor block 14 makes ohmic contact with electrode 18 by means, for example, of a solder joint at 19. As will be discussed, where block 14 is predominantly $Cu_3SbSe_4$ which is of p-type conductivity as made, region 17 may constitute the unconverted material and, therefore, be of p-type conductivity, while region 16 of n-type conductivity may be produced, for example, by doping with a significant impurity such as iodine from group VII of the periodic table according to Mendelyeev.

In the description of the device of Fig. 2 as in the description of the device of Fig. 1, it is not considered to be within the scope of this description to set forth contacting means and other design criteria well known to those familiar with the fabrication of semiconductive devices.

Figure 3:
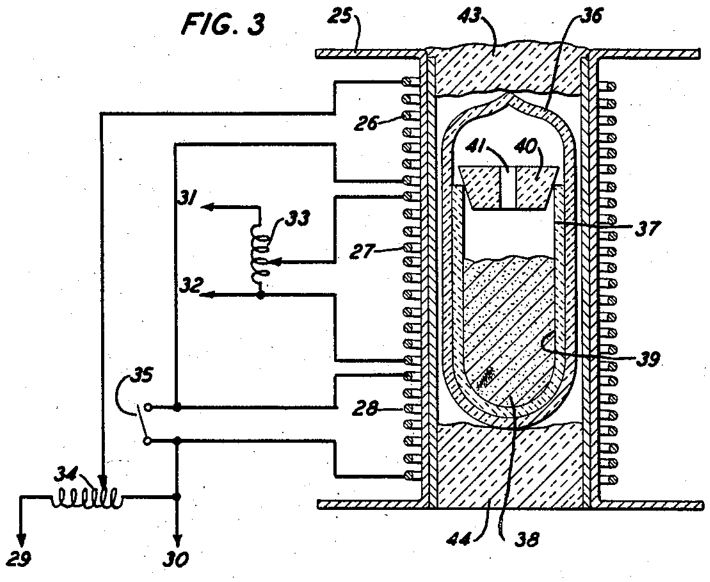
Fig. 3 is a schematic cross-sectional view of apparatus used in the preparation of the compound of this invention.

Fig. 3 depicts one type of apparatus found suitable for the preparation of the semiconductive compound herein. Reference will be made to this figure in the example relating to the actual preparation of this compound. The apparatus of this figure consists of a resistance wire furnace 25 containing three individual windings 26, 27 and 28 as indicated schematically, these windings comprising turns of platinum-20 percent rhodium resistance wire. In operation, an electrical potential is applied across terminals 29 and 30 and also across terminals 31 and 32 by means not shown. The amount of current passing through resistance winding 27 is controlled by means of an autotransformer 33 while the amount of current supplied to windings 26 and 28 is controlled by autotransformer 34, so that the temperature of the furnace within winding 27 may be controlled independently of the temperature in the furnace within windings 26 and 28. Switch 35 makes possible the shunting of winding 28 while permitting current to pass through winding 26. The functions served by autotransformers 33 and 34 and switch 35 are explained in conjunction with the general description of the method of synthesis.

Within furnace 25 there is contained sealed container 36 which may be made of silica and may, for example, be of an inside diameter of the order of 19 millimeters within which there is sealed a second silica crucible 37 containing the component materials 38 used in the synthesis of the compound of this invention. Coating 39 on the inner surface of crucible 37 may be of a material such as carbon and has the effect of reducing adherence between surface 39 and the final compound. Inner crucible 37 is closed at its upper end with graphite cap 40 having hole 41 so as to prevent possible boiling over into container 36 and to minimize heating of charge during sealing off of container 36. In the synthesis of the materials herein thermal losses are reduced and temperature control gained by use of insulation layers 43 and 44 which may, for example, be Sil-O-Cel refractory.

The following is a general outline of a method of preparation used in the synthesis of the compound of this invention. Reference will be had to this general outline in the example which sets forth the specific starting materials and conditions of processing utilized in the preparation of the compound herein.

In the preparation of the compounds of this invention, it was found necessary to coat the inner surface of the inner crucible 37 to prevent reaction between the crucible and the materials therein contained. It was found that a suitable coating was produced by exposure of the crucible to a mixture of four parts of nitrogen and one part of methane for a period of 15 minutes at a flow rate of approximately 250 cubic centimeters per minute with the crucible at a temperature of about 1000° C. After coating the charge was placed in crucible 37 which was then stoppered with cap 40 and placed within container 36. Outer container 36 was then evacuated, filled with tank nitrogen at a pressure of two-thirds of an atmosphere, and was sealed and placed within furnace 25. With switch 35 open, an electrical potential was then applied across terminals 29 and 30 and also terminals 31 and 32 and autotransformers 33 and 34 were adjusted so as to result in a temperature in the central portion of the furnace of from about 950° C. to about 1050° C. and preferably about 1000° C. and so as to result in furnace temperatures within windings 26 and 28 of from about 75° C. to about 100° C. higher than that of the central portion of the furnace. The upper and lower portions of the furnace were maintained at a higher temperature to prevent dynamic loss by vaporization and condensation of vaporizable constitutents.

The furnace was maintained at the temperatures and gradients indicated in the paragraph preceding for a period of about two hours after which power to terminals 31 and 32 was terminated and switch 35 was closed so as to shunt winding 28, thus creating a temperature gradient with the high end of the gradient at the top of the furnace and the low end of the gradient at the bottom of the furnace as the melt cooled. Under the conditions indicated temperature gradient was from a high of about 1100° C. to a low of about 900° C. This gradient was maintained for a period of about one hour after which the current was turned off and the melt permitted to return to room temperature.

Heating of the furnace was gradual taking about four hours from room temperature to the high temperature of about 1100° C. so that the major portion of the alloying was carried out over a range of temperature at which the vapor pressure of selenide is relatively low, thereby minimizing loss of this vaporizable material. The average weight of the resultant ingots was about 60 grams. Microscopic examination and thermal analysis showed that the compounds were single phase. The melting point and energy gap are reported in the example which follows:

*Example*

$Cu_3SbSe_4$ was prepared in accordance with the above outline using a mixture of 17.88 grams of copper, 11.4 grams of antimony and 29.6 grams of selenium. These materials were thoroughly mixed with a spatula before being placed in crucible 37. The final ingot was single phase, had a melting point of 425° C., an energy gap of 0.2 electron volt and was of p-type conductivity.

In the example above, it was found that particle size of starting constituents was not critical. Actual particle sizes used varied from about 0.1" to about 0.5".

The compounds of this invention manifests hole conductivity and is, therefore, an extrinisc semiconductor as made.

The conductivity type of the compound of this invention has been successfully converted by the use of small amounts of doping elements. In accordance with conventional doping theory the conductivity type of the ternary compound herein may be caused to approach n-type material by substitution of any one of the elements of the compound by any element having a larger number of electrons in its outer ring, and may be caused to approach p-type by such substitution with an element having a smaller number of such electrons. The determination of practical significant impurities additionally depends upon physical and chemical characteristics which will permit such substitution without appreciably affecting the crystallography and the chemical composition of the compound. A substantial amount of study has been given these considerations in the field of doping of semiconductive materials in general and criteria upon which an accurate predication may be premised are available in the literature, see for example, L. Pincherle and J. M. Radcliffe, Advances in Physics, volume 5, 19, July 1956, page 271.

In general, it has been found that if the extrinsic element so chosen is chemically compatible with both the compound and the atmosphere to which the compound is exposed during high temperature processing, this element, if it has an atomic radius which is fairly close to that of one of the elements of the ternary compound, will seek out a vacancy in the lattice and will occupy a site corresponding with that of that element of the compound. Doping may be effected also by introduction of small atoms which appear to occupy interstitial positions as, for example, lithium in germanium and hydrogen in zinc oxide.

In accordance with the above, it has been found that iodine from group VII of the periodic table having a radius of 1.33 A. will readily occupy a selenium site in the compound of this invention, and thereby act as a significant impurity inducing n-type conductivity. Selenium is an element from the sixth group of the periodic table and has a radius of 1.17 A. Other elements from the seventh group of the periodic table have a similar effect. It has been found that chlorine, for example, having a radius of 0.99 A. also substitutes for selenium and induces n-type conductivity although it is not generally considered to be a suitable significant impurity since it is extremely reactive with moisture, and precautions must be taken to keep the atmosphere dry during its introduction. Starting with the compound herein which exhibits p-type conductivity as made, p-n junctions are produced by diffusing iodine into the solid material. Manganese having an atom radius of 1.17 A. is also effective as a donor.

In common with experience gained from studies conducted on other semiconductor systems, it is found that addition of impurities in amounts of over about 1 percent by weight may result in degenerate behavior. Amounts of significant impurity which may be tolerated are generally somewhat lower and are of the order of 0.01 atomic percent. However, it is not to be inferred from this observation that semiconductor devices of this invention must necessarily contain 99 percent or more of a particular semiconductive compound disclosed herein. It is well established that desirable semiconductive properties may be gained by the combination of two or more semiconductive materials, for example, for the purpose of obtaining a particular energy gap value. For this reason, the compound of this invention may be alloyed with any other semiconductive material without departing from the scope of this invention.

This invention is limited to semiconductor systems utilizing the compound $Cu_3SbSe_4$ and to devices containing such material.

Although the invention has been described primarily in terms of specific doping elements and specific devices, it is to be expected that the wealth of information gained through studies conducted on other semiconductor systems may be used to advantage in conjunction with this invention. Refining and processing methods, as also diffusion and alloying procedures and other treatment known to those skilled in the art, may be used in the preparation of materials and devices utilizing the compound herein, without departing from the scope of this invention. Other device uses for the compounds herein are also known.

What is claimed is:

1. A semiconductor system containing $Cu_3SbSe_4$.

2. A semiconducting material consisting essentially of at least 99 percent by weight of $Cu_3SbSe_4$.

3. A semiconducting material in accordance with the composition of claim 2 containing up to 0.01 atomic percent of a significant impurity.

4. A semiconducting material in accordance with claim 3 in which the significant impurity is an element of group VII of the periodic table in accordance with Mendelyeev.

5. A semiconducting material in accordance with claim 4 in which the significant impurity is iodine.

6. The semiconductor system of claim 1 in which 99 percent by weight of other material therein contained exhibits semiconducting properties.

7. A semiconductor device consisting essentially of a body of material of the system of claim 1 and having at least one rectifying contact made thereto.

8. The device of claim 7 in which rectification is by means of a point-type electrode making contact with the said body.

9. The device of claim 7 in which the rectifying contact is made by means of a p-n junction.

10. A semiconductor transducing device comprising a body of material of the composition of the system of claim 1, said body containing at least one p-n junction.

11. A semiconductor transducing device comprising a body of material of the composition of the system of claim 2, said body containing at least one p-n junction.

References Cited in the file of this patent

FOREIGN PATENTS 1,120,304 France ---------------- Apr. 16, 1956

OTHER REFERENCES

Mellor: Comprehensive Treatise on Inorganic and Theoretical Chemistry, Longmans, Green and Company, London, 1923, vol. 3, page 7.